United States Patent [19]

Hilton et al.

[11] Patent Number: 4,876,587
[45] Date of Patent: Oct. 24, 1989

[54] ONE-PIECE INTERCONNECTION PACKAGE AND PROCESS

[75] Inventors: Robert Hilton, Border Town, Australia; Ali Emamjomeh, Sunnyvale; Jagdish Belani, Cupertino, both of Calif.

[73] Assignee: National Semiconductor Corporation, Santa Clara, Calif.

[21] Appl. No.: 46,988

[22] Filed: May 5, 1987

[51] Int. Cl.⁴ .................. H01L 23/48; H01L 23/28; H01L 23/02
[52] U.S. Cl. ..................................... 357/70; 357/68; 357/72; 357/74
[58] Field of Search .................. 357/70, 68, 72, 74

[56] References Cited

U.S. PATENT DOCUMENTS 4,733,293   3/1988   Jarvis ..................................... 357/70

FOREIGN PATENT DOCUMENTS 57-79653   5/1982   Japan ................................... 357/70
57-155760  9/1982   Japan ................................... 357/70
58-27352   2/1983   Japan ................................... 357/70
61-152050  7/1986   Japan ................................... 357/70
83/03164   9/1983   PCT Int'l Appl. .................. 357/70

Primary Examiner—Andrew J. James
Assistant Examiner—Ngan Van Ngo
Attorney, Agent, or Firm—Flehr, Hohbach, Test, Albritton & Herbert

[57] ABSTRACT

A one-piece interconnection structure (10) for an SO package (60) is formed from a single sheet strip (12) of copper having a thickness of about 8 mils. Contact finger patterns (14) are formed from a plurality of contact fingers (22) which extend in cantilever fashion. The fingers (22) have tips (24) of a reduced thickness of between about 2-3 mils. Stress relief slots (26) having a depth of about 2 mils are formed in the underside of each finger (22) spaced back from the tips (24) to give the fingers increased flexibility for downward bending during assembly operations. Vertical slots (28) on opposing sides of the fingers behind the stress relief slots give increased lateral flexibility to the fingers. Steps (30) extend vertically along the lateral fingers (22) and have two surfaces (32 and 34) angularly disposed with respect to central surface (36) on the top and bottom fingers. In combination, the stress relief slots (26), vertical slots (28) and the different configuration of the steps (30) make the fingers (22) have the same flexing characteristics in response to bending forces on them, even though the fingers (22) have different shapes depending on their positions in the finger pattern (14). The contact fingers (22) and the reduced thickness tips (24) are formed by masking strip (12) with photoresist in patterns on the top and bottom of the strip to define the contact fingers, but leaving the strip exposed on its top surface where the reduced thickness tips are to be formed, and directing spray etchant at the top of the strip and at the bottom of the strip at different pressures.

8 Claims, 2 Drawing Sheets

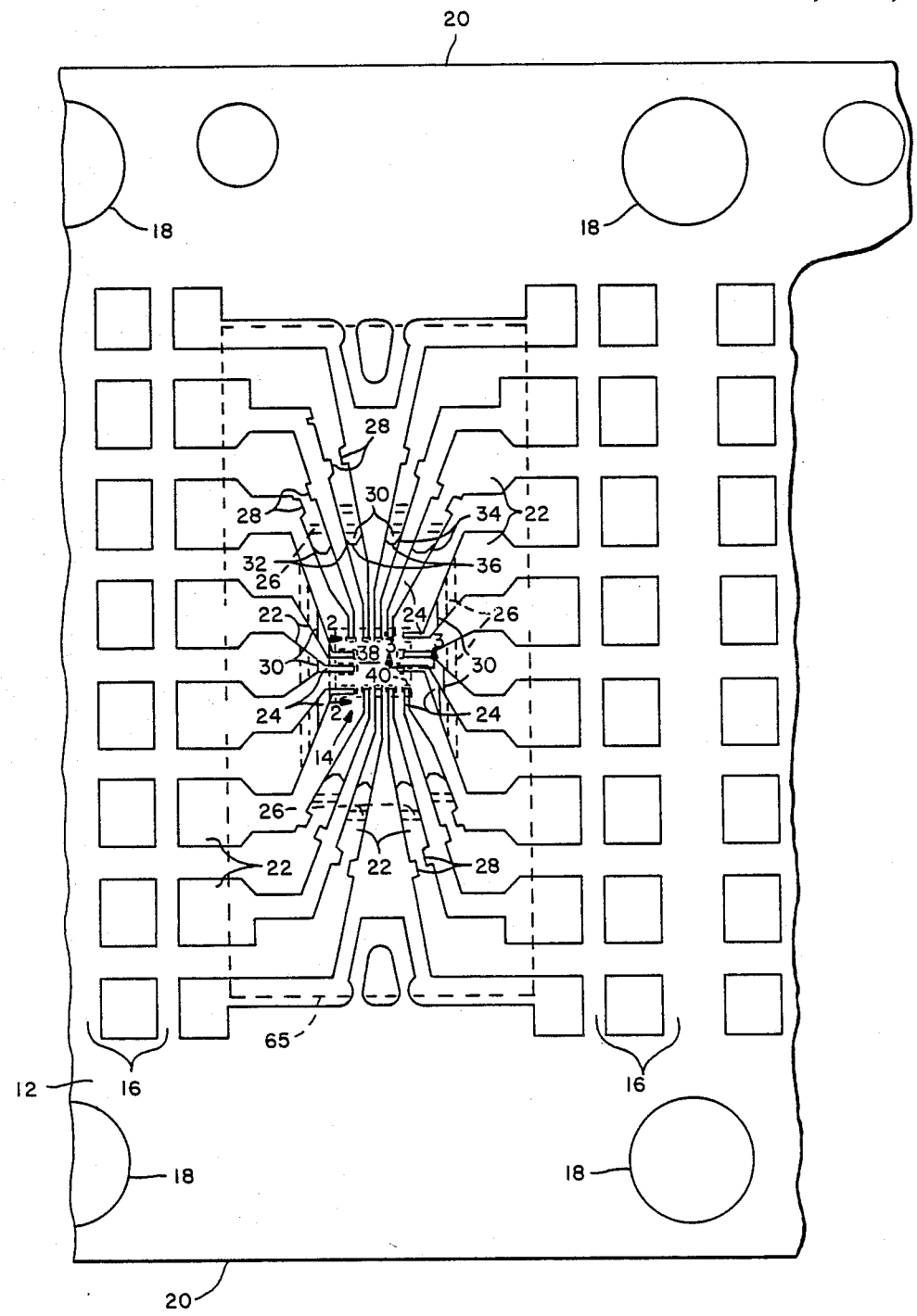
FIG.—1

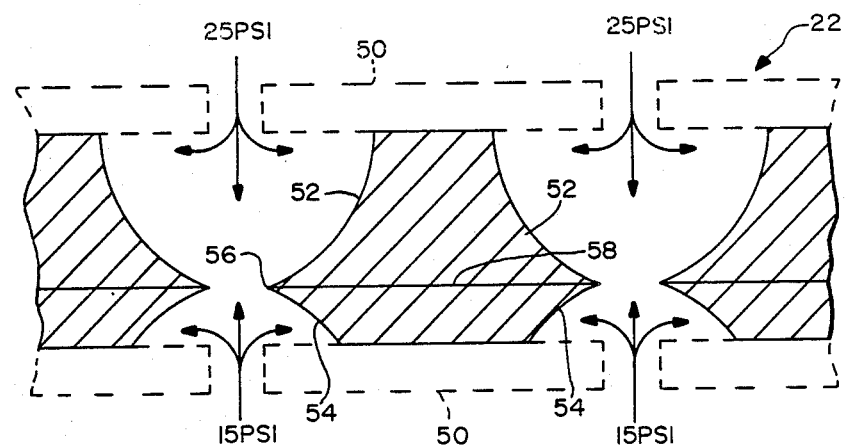
FIG.—2
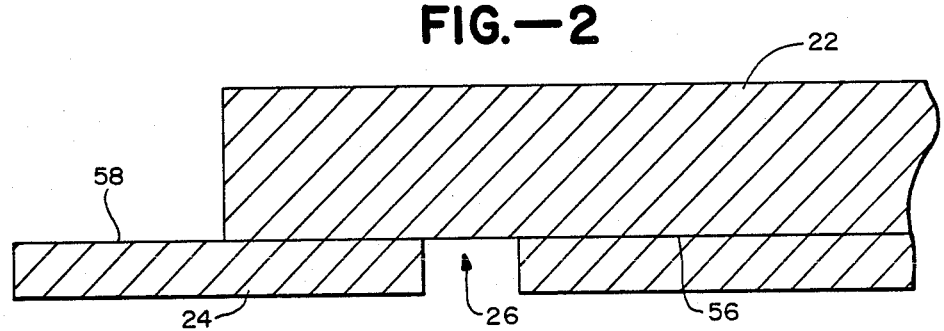
FIG.—3
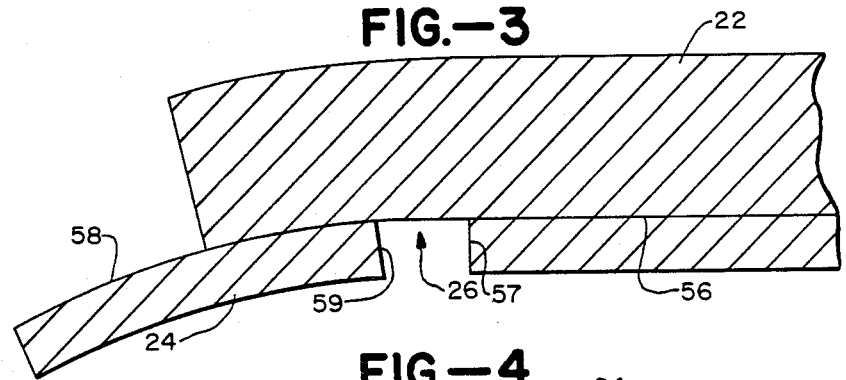
FIG.—4
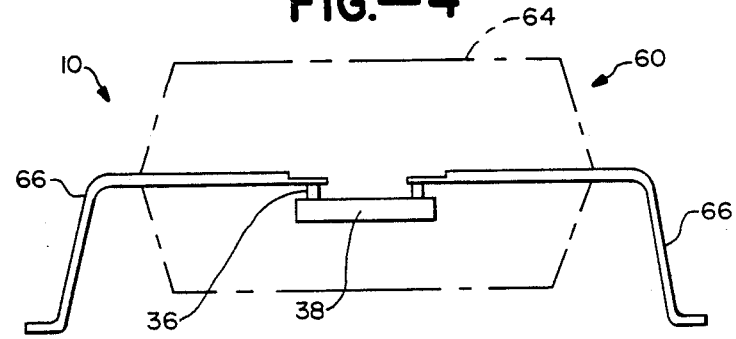
FIG.—5

ONE-PIECE INTERCONNECTION PACKAGE AND PROCESS

CROSS-REFERENCE TO RELATED APPLICATIONS

This application covers an invention which is related to the inventions disclosed and claimed in the following copending, commonly assigned applications: application Ser. No. 628,106, Filed July 5, 1984 in the name of Thanomsak Sankhagowit and entitled "Pretestable Semiconductor Die Package and Fabrication Method," and application Ser. No. 878,930, filed June 26, 1986 in the names of Ali Emamjomeh and Richard Rice and entitled "Hinge Tape."

BACKGROUND OF THE INVENTION

1. Field of the Invention

This invention relates to an improved form of a semiconductor device package and to a process for making the package. More particularly, it relates to such a package in which a one-piece interconnection structure is used to provide a connection from the semiconductor device inside the package to the next level of packaging, such as a circuit board or module, and to a process for making the package including the one-piece interconnection structure.

2. Description of the Prior Art

In conventional packages for integrated circuits, the integrated circuit is sealed in a package with a lead frame extending from inside the package to form two lines of leads extending along opposing sides of the package. As originally developed, wire connections extend from contact pads on the integrated circuit to ends of the lead frame surrounding the integrated circuit and spaced from it. While automated wire bonding equipment was developed to attach these wire connections to the integrated circuit and to the lead frame, the wire bonding step became a production bottleneck, and a more efficient way to connect the integrated circuits to the lead frames was desired.

More recently, the so-called tape automated bonding (TAB) package and process has replaced wire bonded packages for many integrated circuits. In the TAB package and process, a metallic tape, which is thinner than the lead frame but similar in construction, is used to connect bonding pads on the integrated circuit to the ends of the lead frame inside the package. Unlike wire bonding, all of the connections between the integrated circuit and the tape are formed simultaneously in the TAB package and process. Both the lead frame and the metallic tape are formed in the required pattern of leads by spray etching planar strips of different thickness metal which have been masked to produce to desired patterns. While the TAB package and process represents a substantial improvement over the earlier wire bonding package and process, separate bonding steps are still required to attach the integrated circuit to the metallic tape (inner lead bond) and to attach the metallic tape to the lead frame (outer lead bond).

It has been recognized as desirable to provide a one-piece interconnection between the integrated circuit inside the package and the next level of packaging. Such a structure in the form of a package having leads formed from a single thickness of interconnection metal is disclosed, for example, in the first related application identified above. Attempts have been made to provide a tape structure having reduced lead thickness contact fingers for attaching to the integrated circuit by masking a metal strip of the thickness used for tapes on one side with a pattern for the desired interconnection and on the other side with a pattern which will allow the interconnection to be reduced in thickness near the ends which are to be bonded to the integrated circuit, in an effort to provide more flexibility in the contact fingers near their attachment to the integrated circuit. The so-masked structure is then spray etched from both sides. Such spray etching results in a structure in which the interconnection contact fingers near the ends to be attached to the integrated circuit have half the thickness of the remainder of the tape, since the etching from both sides breaks through at the middle of the thickness of the tape. Such a structure and process is disclosed, for example, in the second related application identified above. The structure and process as taught in this application is not suitable for approximating the physical characteristics of a two-piece lead frame-tape structure, because the starting lead frame thickness must meet existing standards for the type of package being fabricated. Specifying the thickness of the lead frame structure also defines the thickness of the reduced thickness fingers in the prior art structure and process, i.e., it is half the thickness of the rest of the structure, and the resulting structure does not match the characteristics of the lead frame-tape structure.

In an interconnection structure, the contact fingers extend at different angles with respect to the opposing edges of the structure toward the interiorly located integrated circuit chip. During assembly operations, the interconnection structure is flexed, and these different extending angles result in distortion of the contact fingers. The second related application discloses the use of certain areas of reduced thickness in an effort to increase flexibility of an assembly tape, but the patterns so employed do not solve the problem of contact finger distortion.

SUMMARY OF THE INVENTION

Accordingly, it is an object of this invention to provide a one-piece interconnection structure between an integrated circuit inside a hermetically sealed package and a next level of packaging in which the one-piece interconnection structure will at least approximate the physical characteristics of a two-piece structure consisting of a contact tape bonded to a lead frame.

It is another object of the invention to provide a process for fabricating a one-piece interconnection structure that will permit different ratios of lead frame and contact finger thicknesses.

It is a further object of the invention to provide a one-piece interconnection structure incorporating stress relief areas that will deform to adjust to external forces applied to the one-piece interconnection structure during assembly operations.

The attainment of these and related objects may be achieved through use of the novel one-piece interconnection structure, package incorporating the structure and process for making the one-piece interconnection structure herein disclosed. A one-piece interconnection structure in accordance with the invention has a plurality of conductive metal leads with outwardly directed first ends and second ends directed inward to surround a centrally disposed area. The second ends form a plurality of contact fingers with tips extending in cantilever fashion from a remaining portion of the plurality of leads. The contact finger tips are arranged and positioned for bonding to contact pads of an integrated circuit. The remaining portion of the leads have a first thickness and the contact finger tips have a second thickness less than the first thickness. The remaining portion of the leads has a cross-section with upper edges and lower edges forming an intersection between a top and a bottom of the remainder of the leads. The intersection between the upper and lower edges of the leads is closer to one of the top and the bottom of the leads. The contact finger tips have a surface parallel to the top and the bottom of the remainder of the leads and positioned at the same distance between the top and bottom of the remaining portion of the leads as the intersection.

A package in accordance with the invention includes the one-piece interconnection structure and an integrated circuit having a plurality of contact pads each bonded to one of the contact finger tips. A sealed enclosure is provided over the integrated circuit and the contact finger tips. This package does not require an outer lead bond step, since the interconnection structure is one-piece.

In a process in accordance with the invention, a strip of a conductive metal having a first thickness and top and bottom surfaces is provided. The top and bottom surfaces are masked with patterns to define a plurality of conductive leads and to leave one of the surfaces exposed to define a contact finger tip at an end of each conductive lead. A spray etchant is directed at the top surface of the conductive metal strip at a first pressure. The spray etchant is directed at the bottom surface of the conductive metal strip at a second pressure different than the first pressure until the spray etchant breaks through the conductive metal strip to define the plurality of leads and the contact finger tips. By adjusting the pressure differential between the first and the second pressures, different relative thicknesses between the contact finger tips and the remainder of the leads can be obtained.

The attainment of the foregoing and related objects advantages and features of the invention should be more readily apparent to those skilled in the art, after review of the following more detailed description of the invention, taken together with the drawings, in which:

BRIEF DESCRIPTION OF THE DRAWINGS

FIG. 1 is a plan view of a one-piece interconnection structure in accordance with the invention.

FIG. 2 is a cross-section view taken along the line 2—2 in FIG. 1. along the line FIG. 3 is a cross-section view taken 3—3 in FIG. 1. FIG. 3, but in FIG. 4 shows the cross section of a different position to show operation of the invention.

FIG. 5 is a side view of an integrated circuit package in accordance with the invention.

DETAILED DESCRIPTION OF THE INVENTION

Turning now to the drawings, more particularly to FIGS. 1-3, there is shown an interconnection structure 10 in accordance with the invention for a small outline (SO) package, during assembly of an integrated circuit package 11 (FIG. 4) in accordance with the invention. The structure 10 is formed from a single sheet strip 12 of copper having a nominal thickness of about 8 mils (0.008 inch). In practice, the strip 12 contains a multitude of finger patterns 14 called personality windows arranged in a side-by-side fashion separated by laterally extending dam bars 16, so called because they prevent plastic used to mold the completed package from travelling outward along the finger patterns 14 during the molding step. The finger patterns are later separated along the dam bars 16 in the process of assembling the package 11. Locater holes 18 extend in rows along upper and lower rails 20 of the structure and are used to move the strip 12 through automated assembly equipment during fabrication of the package 11. The finger patterns 14 are formed from a plurality of fingers 22 which extend in cantilever fashion from the dam bars 16. The fingers 22 have tips 24 of a reduced thickness of between about 2-3 mils (0.002-0.003 inch). Stress relief slots 26 having a depth of about 2 mils are formed in the underside of each finger 22 spaced back from the tips 24 to give the fingers 22 increased flexibility for downward bending during assembly operations, such as inner lead bonding Vertical slots 28 on opposing sides of the fingers 22 behind the stress relief slots give increased lateral flexibility to the fingers 22. Steps 30 extend vertically along the lateral fingers 22 and have two surfaces 32 and 34 angularly disposed with respect to central surface 36 on the top and bottom fingers. In combination, the stress relief slots 26, vertical slots 28 and the different configuration of the steps 30 make the fingers 22 have the same flexing characteristics in response to bending forces on them, even though the fingers 22 have different shapes depending on their positions in the finger pattern 14. Such matching flexing characteristics avoid defective attachment of integrated circuit chip 38 due to misregistration of the fingers 22 with respect to bonding pads 40 on the chip 38.

The interconnection structure 10 is formed by masking a planar copper strip on its top and bottom surfaces with photoresist patterns in a conventional manner and spray etching the strip from both top and bottom until the etchant breaks through to form the fingers 22, the dam bars 16, and the locater holes 28. The photoresist pattern on the top of the strip 12 leaves the top surface exposed where the tips 24 of the fingers 22 are to be formed, but the bottom surface is masked. In order to provide a thickness of about 2—3 mils for the tips 24 with a thickness of about 8 mils for the remainder of the interconnection structure, a higher pressure is employed for the spray etchant directed at the top of the strip 12 than at the bottom. For the above resulting thicknesses, an etchant pressure on the top of the strip 12 of about 25 psi and an etchant pressure on the bottom of the strip 12 of about 15 psi could be employed. For different thickness ratios of the remainder of the interconnection structure to the finger tips, different spray etchant nozzles, different placement of the nozzles relative to the strip surface or different etchants, other pressure differentials are employed. The interconnection structure 10 can be etched either in sheet or strip form, including reel-to-reel form. Other than the use of a pressure differential between the top and bottom of the strip 12, the spray etching process used to form the interconnection structure 10 is conventional and will not be described further.

FIG. 2 shows the cross-section structure of the fingers 22 which results from the differential pressure etching process. Where the photoresist layers 50 are present, undercutting occurs as shown, so that upper and lower edges 52 and 54, which are both present everywhere in the interconnection structure 10 except at the reduced thickness tips 24 of the fingers 22, have arcuate shapes which intersect closer to the bottom of the strip 12 where the top and bottom etching breaks through to form the pattern shown in FIG. 1. The arc radius of the upper edges 52 is greater than the arc radius of the lower edges 54, since a greater amount of etching takes place from the top of the strip 12, due to the greater etchant pressure employed for the top spray. At the tips 24, only the lower edges 54 are present, and the top of the strip 12 is etched away down to the level of the intersection 56 to form top surface 58 of the tips 24 (See also FIG. 3). The stress relief slots 26 (FIGS. 1 and 3) are formed on the bottom surface of the strip 12 by providing appropriate openings in the bottom photoresist layer 50, if the stress relief slots are to extend from the bottom surface to the distance of intersection 56. If a different depth is desired for the slots 26, they can be formed in a separate masking and etching operation. Alternatively, the slots 26 and the vertical slots 28 can be formed by a stamping operation. Vertical slots 28 could also be formed in a separate making and etching operation.

FIG. 4 shows how the slot 26 flexes when downward pressure is applied to the tip 58 of the finger 22. Front wall 59 of the slot 26 is free to move toward rear wall 57 due to the material removed in the slot 26. As a result, the flexibility of the finger 22 is increased substantially more than would be expected from the small amount of material removed in the slot 26. The vertical slots 28 function in the same manner.

FIG. 5 shows a plastic integrated circuit package 60 incorporating the one-piece interconnection structure 10. Plastic body 62 mates with plastic top 64 at the interconnection structure 10 to form a hermetically sealed container for the integrated circuit chip 38 bonded to the interconnection structure 10. Package outline 65 in FIG. 1 shows the extent of coverage of the interconnection structure 10 by the plastic body 62 and top 64. Leads 66 extending from the body 62 and top 64 meet established standards for lead frame leads conventionally employed in integrated circuit packages. Other than in its use of the one-piece interconnection structure 10, the configuration and fabrication of the package 60 is conventional and will not be described further.

It should now be readily apparent to those skilled in the art that a novel one-piece interconnection structure, process for making the one-piece interconnection structure and integrated circuit package capable of achieving the stated objects of the invention has been provided. The interconnection structure can be configured to duplicate the mechanical characteristics of a conventional two-piece tape and lead frame interconnection structure in an integrated circuit package. Different desired ratios of thickness of the remainder of the interconnection structure to the contact finger tip thickness can be provided with the process.

It should further be apparent to those skilled in the art that various changes in form and details of the invention as shown and described may be made. For example, the interconnection structure could be used in an hermetically sealed package, such as a ceramic dual-in-line package (CERDIP). It is intended that such changes be included within the spirit and scope of the claims appended hereto.

What is claimed is:

1. A one-piece interconnection structure for an integrated circuit, which comprises a plurality of conductive metal leads having body portions with outwardly directed first ends and second ends directed inward to surround a centrally disposed area, a plurality of contact fingers attached to the second ends of said body portions, said contact fingers having tips extending unsupported into the centrally disposed area, said contact finger tips being arranged and positioned for bonding to contact pads of an integrated circuit, said body portions of said leads having a first thickness and said contact finger tips having a second thickness less than the first thickness, said body portions of said leads having a cross-section with upper sides and lower sides forming an intersection between a top surface and a bottom surface of said body portions of said leads, said intersection between said upper and lower sides of said body portions of said leads being closer to one of said top surface and said bottom surface of said body portions of said leads, said contact finger tips having a surface parallel to said top surface and said bottom surface of said body portions of said leads, said surface of said contact finger tips being aligned with said intersection.

2. The one-piece interconnection structure for an integrated circuit of claim 1 in which said upper and lower sides have an arcuate shape and different radii of curvature.

3. The one-piece interconnection structure for an integrated circuit of claim 1 in which the second thickness is less than half of the first thickness.

4. The one-piece interconnection structure for an integrated circuit of claim 1 in which said leads have horizontal stress relief grooves extending across one of said top surface and said bottom surface of said body portions facing away from said surface of said contact finger tips.

5. The one-piece interconnection for an integrated circuit of claim 4 in which said body portions of at least some of said leads have a pair of opposed, vertical grooves extending between the top surface and the bottom surface of said body portions.

6. The one-piece interconnection for an integrated circuit of claim 1 attached to an integrated circuit with a plurality of contact pads on said integrated circuit each bonded to one of said contact finger tips.

7. The one-piece interconnection structure for an integrated circuit of claim 6 enclosed in a sealed enclosure over said integrated circuit and said contact finger tips.

8. The one-piece interconnection for an integrated circuit of claim 8 in which said sealed enclosure comprises a plastic body and a plastic top bonded to said plastic body with the first ends of said leads extending from said sealed enclosure.

* * * * *